(12) United States Patent
Kondo (10) Patent No.: US 9,468,105 B2
(45) Date of Patent: Oct. 11, 2016

(54) ELECTRONIC COMPONENT, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/659,178

(22) Filed: Mar. 16, 2015

(65) Prior Publication Data

US 2015/0282322 A1  Oct. 1, 2015

(30) Foreign Application Priority Data

Mar. 25, 2014  (JP) .................... 2014-062373

(51) Int. Cl.
*H03L 1/02* (2006.01)
*H05K 1/18* (2006.01)
*H05K 1/02* (2006.01)
*H05K 3/46* (2006.01)

(52) U.S. Cl.
CPC .............. *H05K 1/18* (2013.01); *H05K 1/0212* (2013.01); *H05K 3/4697* (2013.01); *H05K 2201/09845* (2013.01); *H05K 2201/1056* (2013.01); *H05K 2201/10068* (2013.01); *H05K 2201/10075* (2013.01); *H05K 2201/10151* (2013.01); *H05K 2201/10219* (2013.01); *H05K 2201/10515* (2013.01); *H05K 2201/10553* (2013.01)

(58) Field of Classification Search
CPC ........................................................ H03L 1/028
USPC .................................... 331/69; 310/343, 344
See application file for complete search history.

(56) References Cited

U.S. PATENT DOCUMENTS

| 5,917,272 A | * | 6/1999 | Clark | ........................ H03H 9/08 219/210 |
| 6,501,340 B1 | * | 12/2002 | Flood | ........................ H03L 1/04 310/315 |
| 7,978,016 B2 | | 7/2011 | Naito | |

FOREIGN PATENT DOCUMENTS

| JP | 2001-500715 A | 1/2001 |
| JP | 2004-096163 A | 3/2004 |
| JP | 2008-301226 A | 12/2008 |
| JP | 2010-050508 A | 3/2010 |
| JP | 2010-177732 A | 8/2010 |
| JP | 2010-183324 A | 8/2010 |
| JP | 2010-187263 A | 8/2010 |
| JP | 2010-199778 A | 9/2010 |
| JP | 2012-129679 A | 7/2012 |

* cited by examiner

*Primary Examiner* — Joseph Chang
(74) *Attorney, Agent, or Firm* — Oliff PLC (57) ABSTRACT

An electronic component includes a pedestal plate that has a first surface made of a metal and a second surface being an opposite surface to the first surface, a heating element arranged on the first surface of the pedestal plate, and a resonator element arranged on the heating element. The pedestal plate overlaps the resonator element in a plan view.

18 Claims, 5 Drawing Sheets

ELECTRONIC COMPONENT, ELECTRONIC APPARATUS, AND MOVING OBJECT

The present application claims priority to Japanese Patent Application JP 2014-062373, filed Mar. 25, 2014, the entire disclosure of which is hereby incorporated by reference.

BACKGROUND

1. Technical Field

Various embodiments of the present invention relate to an electronic component, an electronic apparatus, and a moving object.

2. Related Art

As an electronic component which is used in a reference frequency signal source of a communication instrument, a measurement instrument, or the like, a quartz crystal oscillator is known. The quartz crystal oscillator requires a stable output frequency with respect to change in temperature with high accuracy. In general, of the crystal oscillators, as a quartz crystal oscillator which obtains extremely high frequency stability, an oven controlled quartz crystal oscillator (OCXO) is known. The OCXO has a quartz crystal resonator which is housed in a thermostat oven controlled at constant temperature.

For example, JP-T-2001-500715 discloses an OCXO which includes a thermally conductive substrate, a heater element arranged on the thermally conductive substrate, and a quartz crystal resonator arranged on the substrate through a clip. In the OCXO described in JP-T-2001-500715, the heater element heats the substrate, and the quartz crystal resonator can be heated uniformly by heat emission (heat radiation) from the surface of the substrate or conduction heat transmitted through the substrate and the clip.

However, in the OCXO (electronic component) described in JP-T-2001-500715, since heat generated by the heater element (heating element) is transmitted (heat conduction) to the quartz crystal resonator (resonator element) through the substrate and the clip, the conduction path of heat may be extended, and the efficiency of heating the quartz crystal resonator may be deteriorated.

SUMMARY

An advantage of some aspects of various embodiments of the invention is to provide an electronic component capable of efficiently heating a resonator element. Another advantage of some aspects of various embodiments of the invention is that it provides an electronic apparatus and a moving object including the electronic component.

The various embodiments of the invention can be implemented as the following forms or application examples.

Application Example 1

An electronic component according to this application example includes a pedestal plate which has a first surface and a second surface to be an opposite surface of the first surface, the first surface being made of a metal, a heating element which is arranged on the first surface of the pedestal plate, and a resonator element which is arranged on the heating element. The pedestal plate overlaps the resonator element in a plan view.

In the electronic component according to this application example, since the resonator element is arranged on the heating element, for example, it is possible to shorten the conduction path of heat compared to a case where the resonator element is arranged on other members, such as the pedestal plate. In the electronic component according to this application example, the heating element is arranged on the surface made of a metal of the pedestal plate, the surface made of a metal of the pedestal plate and the resonator element face each other, and the pedestal plate and the resonator element overlap each other in a plan view. For this reason, it is possible to heat the resonator element by heat emission (heat radiation) from the surface made of a metal of the pedestal plate heated by the heating element. Therefore, in the electronic component according to this application example, it is possible to efficiently heat the resonator element.

Application Example 2

In the electronic component according to the application example described above, the resonator element may be arranged within a range surrounded by an outer peripheral portion of the pedestal plate in a plan view.

In the electronic component according to this application example, it is possible to more uniformly heat a resonator element.

Application Example 3

In the electronic component according to the application example described above, the pedestal plate may be provided with a protrusion protruding toward the resonator element, and the protrusion may overlap the resonator element in a plan view.

In the electronic component according to this application example, it is possible to increase the path of heat for heating the resonator element and to more uniformly heat the resonator element.

Application Example 4

The electronic component according to the application example described above may further include a circuit board, and an electronic element which is arranged on the circuit board, and the pedestal plate may be arranged on the circuit board and may overlap the electronic element in a plan view.

In the electronic component according to this application example, it is possible to heat the electronic element by heat emission (heat radiation) from the pedestal plate heated by the heating element. With this, it is possible to suppress change in characteristics due to change in temperature of the electronic element.

Application Example 5

The electronic component according to the application example described above may further include a circuit board, and an electronic element which is arranged on the circuit board, and the pedestal plate may be arranged on the electronic element.

In the electronic component according to this application example, since the pedestal plate is arranged on the electronic element, for example, it is possible to shorten the conduction path of heat generated by the heating element to the electronic element compared to when the pedestal plate is arranged on the circuit board. Therefore, it is possible to more efficiently heat the electronic element.

Application Example 6

In the electronic component according to the application example described above, the electronic element may include an oscillation circuit for oscillating the resonator element.

In the electronic component according to this application example, it is possible to reduce errors due to the temperature characteristics of the oscillation circuit. Therefore, it is possible to achieve improvement of frequency stability.

Application Example 7

In the electronic component according to the application example described above, the electronic element may be electrically connected to the circuit board through bumps.

In the electronic component according to this application example, for example, since a wire for electrically connecting the electronic element and the circuit board is not required, it is possible to achieve reduction in size and thickness of the apparatus.

Application Example 8

In the electronic component according to the application example described above, the pedestal plate may be made of the metal as a whole.

In the electronic component according to this application example, the pedestal plate can have high thermal conductivity. Therefore, it is possible to efficiently heat a resonator element.

Application Example 9

In the electronic component according to the application example described above, the material of the metal may be one of copper, gold, silver, aluminum, and tungsten, or an alloy containing one of copper, gold, silver, aluminum, and tungsten as a main component.

In the electronic component according to this application example, the pedestal plate can have high thermal conductivity. Therefore, it is possible to efficiently heat a resonator element.

Application Example 10

An electronic apparatus according to this application example includes any of the electronic components described above.

Since the electronic apparatus according to this application example includes the electronic component which can efficiently heat the resonator element, for example, it is possible to achieve improvement of frequency stability.

Application Example 11

A moving object according to this application example includes nay of the electronic components described above.

Since the moving object according to this application example can include the electronic component which can efficiently heat the resonator element, for example, it is possible to achieve improvement of frequency stability.

BRIEF DESCRIPTION OF THE DRAWINGS

Various embodiments of the invention will be described with reference to the accompanying drawings, wherein like numbers reference like elements.

DETAILED DESCRIPTION

Hereinafter, exemplary embodiments of the invention will be described in detail referring to the drawings. The embodiments described below are not intended to unduly limit the content of the invention described in the appended claims. Besides, all of configurations described below are not necessarily indispensable requirements of the invention.

1. First Embodiment

1.1. Electronic Component

First, an electronic component according to a first embodiment will be described referring to the drawings. Hereinafter, an example where the electronic component according to the first embodiment is an oven controlled quartz crystal oscillator (OCXO) will be described.

Figure 1:
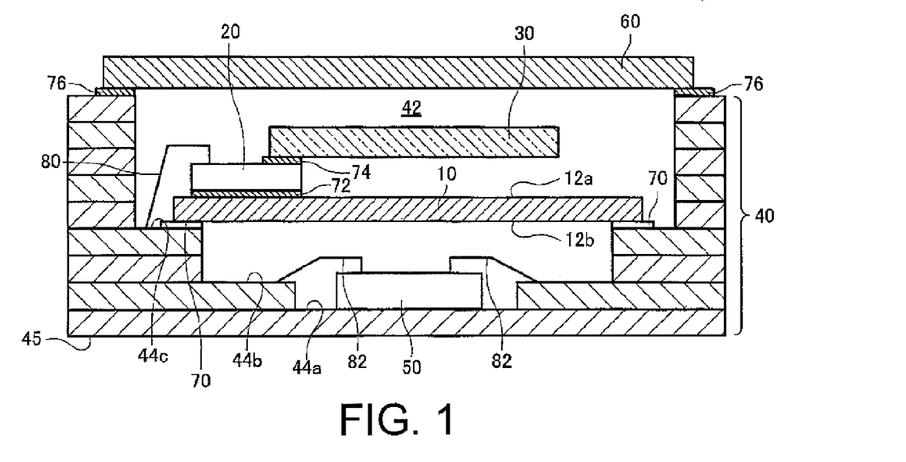
FIG. 1 is a sectional view schematically showing an electronic component according to a first embodiment.
Figure 2:
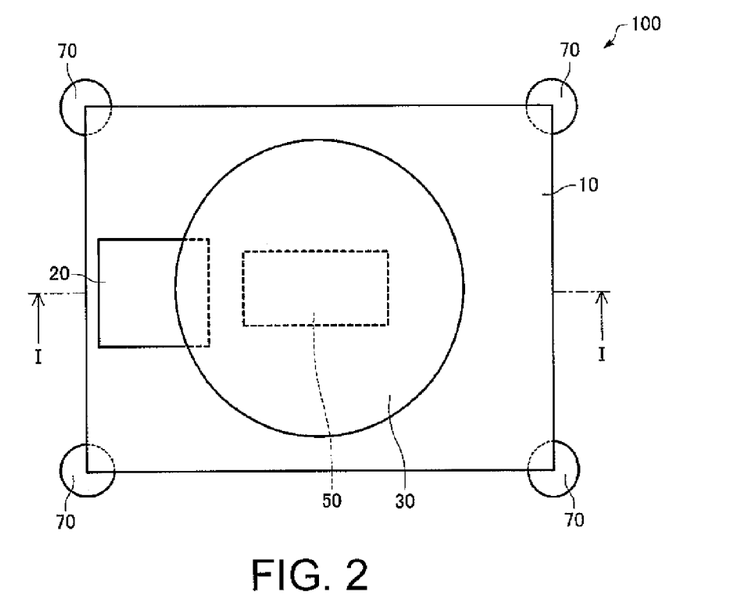
FIG. 2 is a plan view schematically showing an electronic component according to the first embodiment.

FIG. 1 is a sectional view schematically showing an electronic component 100 according to the first embodiment. FIG. 2 is a plan view schematically showing the electronic component 100. FIG. 1 is a sectional view taken along the line I-I of FIG. 2.

As shown in FIGS. 1 and 2, the electronic component 100 includes a mounting plate (pedestal plate) 10, a heating element (heating IC) 20, a resonator element 30, a circuit board 40, and an electronic element (oscillation IC) 50, and a lid 60. In FIG. 2, for convenience, the circuit board 40 and the lid 60 are omitted.

The mounting plate 10 is arranged on the circuit board 40. The mounting plate 10 is connected to the circuit board 40 through a plurality (in the example shown in the drawing, four) of connection members 70. That is, in the example shown in the drawing, the mounting plate 10 is supported at four points. Though not shown, the mounting plate 10 may be connected onto the circuit board 40 through two connection members 70. That is, the mounting plate 10 may be supported at two points. Since it should suffice that the mounting plate 10 is connected to the circuit board 40, the embodiment is not limited to the above-described example, and the mounting plate may be supported at one point, three points, or five or more points.

The connection members 70 are, for example, a conductive adhesive, an insulating adhesive, a solder material (solder, Ag solder, or the like), or the like. When the mounting plate 10 and the circuit board 40 are directly bonded to each other by solid phase bonding or fusion welding, the connection members 70 are, for example, a reaction layer of the material of the mounting plate 10 and the material of the circuit board 40.

The mounting plate 10 is, for example, a plate-shaped member. The planar shape (the shape when viewed from a direction perpendicular to a first surface (upper surface) 12a of the mounting plate 10) of the mounting plate 10 is, for example, a quadrangle (rectangle). The mounting plate 10 has a first surface 12a, and a second surface (lower surface) 12b opposite to the first surface 12a.

As shown in FIG. 2, the second surface 12b of the mounting plate 10 is connected to a third surface 44c of the circuit board 40 through a plurality of connection members 70. In the example shown in the drawing, the planar shape of the second surface 12b of the mounting plate 10 is a quadrangle, and four corner portions of the quadrangle are connected to the circuit board 40 through the connection members 70.

The mounting plate 10 is a plate where the first surface 12a is made of a metal having high thermal conductivity, and the material of the metal is one of copper, gold, silver, aluminum, and tungsten, or an alloy containing one of copper, gold, silver, aluminum, and tungsten as a main component. The mounting plate 10 may be made of, as a whole, one of copper, gold, silver, aluminum, and tungsten, or an alloy containing one of copper, gold, silver, aluminum, and tungsten as a main component. When the material of the mounting plate 10 is an alloy containing the metal as a main component, a sub component is, for example, a metal other than the main component.

Figure 3:
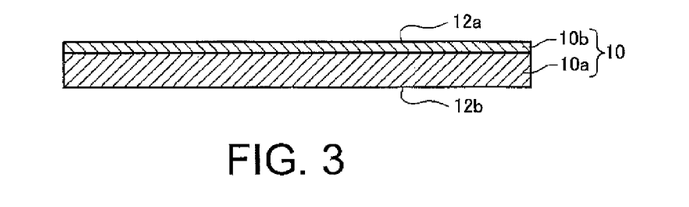
FIG. 3 is a sectional view schematically showing a modification example of a mounting plate of the electronic component according to the first embodiment.

FIG. 3 is a sectional view schematically showing a modification example of the mounting plate 10. As shown in FIG. 3, in the mounting plate 10, if at least the first surface 12a is made of a metal, other portions may be made of a metal, resin, ceramics, glass, glass epoxy, semiconductor crystal, such as silicon, piezoelectric single crystal, such as lithium tantalite, lithium niobate, or quartz crystal, or the like. In the example shown in FIG. 3, the mounting plate 10 has a first layer 10a, and a second layer 10b provided on the first layer 10a. The first layer 10a is a layer made of a material illustrated as other portions described above, and the second layer 10b is a layer made of a metal. The first surface 12a of the mounting plate 10 is the surface (upper surface) of the second layer 10b.

As shown in FIG. 1, the mounting plate 10 is arranged to face the resonator element 30. In the example shown in the drawing, an interval is provided between the mounting plate 10 and the resonator element 30, and the heating element 20, a connection member 72, and a connection member 74 are interposed between the mounting plate 10 and the resonator element 30. The mounting plate 10 is arranged to face the electronic element 50. In the example shown in the drawing, an interval is provided between the mounting plate 10 and the electronic element 50.

As shown in FIG. 2, the mounting plate 10 overlaps the resonator element 30 in a plan view (when viewed from the direction perpendicular to the first surface 12a of the mounting plate 10). In the example shown in the drawing, the mounting plate 10 is positioned below the resonator element 30. The mounting plate 10 overlaps the electronic element 50 in a plan view. In the example shown in the drawing, the mounting plate 10 is positioned above the electronic element 50 in the plan view.

In addition to the heating element 20, the connection member 72, and the connection member 74, other components may be arranged between the mounting plate 10 and the resonator element 30. For example, an electronic component, a plate-shaped member, and the like may be arranged on the mounting plate 10 or the resonator element 30. Other components may be arranged between the mounting plate 10 and the electronic element 50. For example, an electronic component, a plate-shaped member, and the like may be arranged on the mounting plate 10 or the electronic element 50.

In the electronic component 100, the mounting plate 10 is provided, whereby it is possible to secure a space where the resonator element 30 or the element, such as the heating element 20 or the electronic element 50, is arranged, while achieving reduction in size.

The heating element 20 is arranged on the mounting plate 10. The heating element 20 is connected onto the mounting plate 10 (the first surface 12a of the mounting plate 10) through the connection member 72. Similarly to the connection members 70, the connection member 72 is, for example, an adhesive, a solder material, a reaction layer, or the like. The heating element 20 has a plurality of electrodes (pads) on the upper surface of the heating element 20. Each electrode (pad) provided on the upper surface of the heating element 20 and each electrode provided on the third surface 44c of the circuit board 40 are electrically connected by a wire 80.

The heating element 20 is, for example, a heating IC. The heating IC includes, for example, a heating circuit and a temperature sensor. The heating circuit is a circuit which generates heat when a current flows in a resistor. The heating circuit may be an element which generates heat when power of a power transistor or the like is input. In the electronic component 100, for example, the resonator element 30 is arranged on the heating circuit. The temperature sensor is arranged close to the resonator element 30 and outputs a signal according to temperature (for example, a signal having a voltage according to temperature).

Here, the path of heat generated by the heating element 20 will be described. Heat generated by the heating element 20 is transmitted to the resonator element 30 through the connection member 74 by heat conduction. With this, the resonator element 30 is heated. Furthermore, heat generated by the heating element 20 is transmitted to the mounting plate 10 through the connection member 72 by heat conduction. With this, the mounting plate 10 is heated. Since the first surface 12a of the mounting plate 10 is made of a metal, the surface of the mounting plate 10 facing the resonator element 30 is likely to transmit heat. Accordingly, heat is emitted (radiated) from the heated mounting plate 10 to the resonator element 30. The resonator element 30 and the electronic element 50 are heated by heat emission (heat radiation) from the mounting plate 10. Furthermore, heat generated by the heating element 20 is transmitted to the electronic element 50 or an element (not shown) arranged on a lower surface 45 of the circuit board 40 through the connection member 72, the mounting plate 10, the connection members 70, and the circuit board 40 by heat conduction. With this, the electronic element 50 or an element arranged on the lower surface 45 of the circuit board 40 is heated. Even if the mounting plate 10 is made of a metal as a whole, it is possible to obtain the same effects as described above.

Even when other components are arranged between the mounting plate 10 and the resonator element 30 or between the mounting plate 10 and the electronic element 50, for example, an electronic component, a plate-shaped member, and the like are arranged on the mounting plate 10, on the resonator element 30, or on the electronic element 50, other components are heated by heat emission (heat radiation) from the mounting plate 10, and as a result, the resonator element 30 and the electronic element 50 are heated by heat emission (heat radiation) from other components.

The resonator element 30 is arranged on the heating element 20. The resonator element 30 is connected onto the heating element 20 through the connection member 74. In the example shown in the drawing, electrodes provided on a part of the lower surface of the resonator element 30 are connected to the electrodes (pads) provided on the upper surface of the heating element 20 by the conductive connection member 74. Similarly to the connection members 70, the connection member 74 is, for example, an adhesive, a solder material, a reaction layer, or the like. Though not shown, electrodes (pads) provided on the upper surface of the resonator element 30 may be electrically connected to the electrodes provided on the circuit board 40 by wires. If the resonator element 30 and the heating element 20 are mechanically connected together by the connection member 74, since heat generated by the heating element 20 is transmitted to the resonator element 30 through the connection member 74 by heat conduction, the resonator element 30 and the heating element 20 may not be electrically connected together.

As shown in FIG. 2, the resonator element 30 is arranged within the outer peripheral portion (outer edge) of the mounting plate 10 in a plan view. Here, the resonator element 30 being arranged within the outer peripheral portion (outer edge) of the mounting plate 10 in the plan view includes a case where the entire outer edge of the resonator element 30 is inside of the outer edge of the mounting plate 10 in the plan view (see FIG. 2), a case where a part of the outer edge of the resonator element 30 overlaps a part of the outer edge of the mounting plate 10 in the plan view and another part of the outer edge of the resonator element 30 is inside of the outer edge of the mounting plate 10 in the plan view, and a case where the outer edge of the resonator element 30 overlaps the outer edge of the mounting plate 10 in the plan view and a region inside of the outer edge of the resonator element 30 is inside of the outer edge of the mounting plate 10. In the example of FIG. 2, the resonator element 30 overlaps a part of the mounting plate 10 in the plan view as a whole.

The resonator element 30 is an element whose output frequency has temperature characteristics. Specifically, the resonator element 30 is a resonator element (quartz crystal resonator) which uses quartz crystal as a substrate material, and for example, an SC cut or AT cut quartz crystal resonator is used. As this quartz crystal resonator, for example, a mesa quartz crystal resonator where a central portion is thicker than a peripheral portion and the central portion (thick portion) becomes a resonating portion may be used. However, the resonator element 30 may be a surface acoustic wave (SAW) resonator or a micro electro mechanical systems (MEMS) resonator. As the substrate material of the resonator element 30, in addition to quartz crystal, piezoelectric single crystal, such as lithium tantalate or lithium niobate, a piezoelectric material, such as piezoelectric ceramics of lead zirconate titanate or the like, a silicon semiconductor material, or the like may be used. A unit configured to excite the resonator element 30 may use a piezoelectric effect, or electrostatic driving using Coulomb force. The resonator element 30 may be an element which detects a physical quantity, for example, an element for an inertial sensor (acceleration sensor, gyro sensor, or the like) or a force sensor (tilt sensor or the like).

The circuit board 40 is, for example, a ceramic package. In the example shown in the drawing, the circuit board 40 is a ceramic laminate package which is formed by molding and laminating a ceramic green sheet and then performing baking. The circuit board 40 has a concave portion, and the mounting plate 10, the heating element 20, the resonator element 30, and the electronic element 50 are housed in a space (housing chamber) 42 inside the concave portion. In the example shown in the drawing, an opening is provided in the upper portion of the circuit board 40, and the housing chamber 42 is formed by covering the opening with the lid 60.

The circuit board 40 has a first surface 44a, a second surface 44b, and a third surface 44c. In the example shown in the drawing, the first surface 44a is the upper surface of a first layer among nine layers constituting the circuit board 40, the second surface 44b is the upper surface of a second layer, and the third surface 44c is the upper surface of a fourth layer. Since the first surface 44a, the second surface 44b, and the third surface 44c are different in height, two steps are formed in the inside surface of the concave portion by the first surface 44a, the second surface 44b, and the third surface 44c. The first surface 44a is the inner bottom surface of the concave portion.

The electronic element 50 is arranged on the first surface 44a. The second surface 44b is provided with electrodes (not shown) wire-bonded to the respective electrodes of the electronic element 50. The mounting plate 10 is connected to the third surface 44c through the connection members 70. The third surface 44c is provided with electrodes (not shown) wire-bonded to the respective electrodes of the heating element 20.

Inside or on the surface of the circuit board 40, wirings (not shown) for electrically connecting the electrodes wire-bonded to the electrodes of the heating element 20 and the electrodes wire-bonded to the electrodes of the electronic element 50 are provided.

A power supply terminal (not shown), a ground terminal, or other external terminals (an output terminal of an oscillation signal or the like) are provided on the lower surface 45 (the surface opposite to the first surface 44a) of the circuit board 40, and wirings for electrically connecting the power supply terminal, the ground terminal, the heating element 20, and the electronic element 50 or wirings for electrically connecting other external terminals and the electronic element 50 are provided inside or on the surface of the circuit board 40. An element, such as a resistor or a coil constituting the OCXO, may be provided on the lower surface 45 of the circuit board 40.

The electronic element 50 is arranged on the circuit board 40. The electronic element 50 is connected onto the circuit board 40 (first surface 44a) by an adhesive (not shown) or the like. The electronic element 50 has a plurality of electrodes (pads) provided on the upper surface. Each electrode (pad) provided on the upper surface of the electronic element 50 is electrically connected to each electrode provided on the second surface 44b of the circuit board 40 by a wire 82.

As shown in FIG. 2, the electronic element 50 is arranged within the outer peripheral portion (outer edge) of the mounting plate 10 in a plan view. Here, the electronic element 50 being arranged within the outer peripheral portion (outer edge) of the mounting plate 10 in the plan view includes a case where the outer edge of the electronic element 50 is inside of the outer edge of the mounting plate 10 in the plan view, a case where a part of the outer edge of the electronic element 50 overlaps a part of the outer edge of the mounting plate 10 in the plan view and another part of the outer edge of the electronic element 50 is inside of the outer edge of the mounting plate 10 in the plan view, and a case where the outer edge of the electronic element 50 overlaps the outer edge of the mounting plate 10 in the plan view and a region inside the outer edge of the electronic element 50 is inside of the outer edge of the mounting plate 10.

The electronic element 50 is, for example, an oscillation IC. The oscillation IC includes, for example, an oscillation circuit and a temperature control circuit.

The oscillation circuit is a circuit which is connected to both ends of the resonator element 30, and amplifies a signal output from the resonator element 30 and feeds back the signal to the resonator element 30, thereby oscillating the resonator element 30. A circuit constituted by the resonator element 30 and the oscillation circuit may be, for example, various oscillation circuits, such as a pierce oscillation circuit, an inverter oscillation circuit, a Colpitts oscillation circuit, and a Hartley oscillation circuit.

The temperature control circuit is a circuit which controls the amount of a current flowing in the resistor of the heating circuit based on an output signal (temperature information) of the temperature sensor and maintains the resonator element 30 at constant temperature. For example, the temperature control circuit performs control such that a desired current flows in the resistor of the heating circuit when the current temperature determined from the output signal of the temperature sensor is lower than a set reference temperature, and a current does not flow in the resistor of the heating circuit when the current temperature is higher than the reference temperature. For example, the temperature control circuit may perform control such that the amount of a current flowing in the resistor of the heating circuit increases or decreases according to the difference between the current temperature and the reference temperature.

The lid 60 covers the opening of the circuit board 40. The shape of the lid 60 is, for example, a plate shape. As the lid 60, for example, a metal plate made of the same material as the circuit board 40, kovar, 42 alloy, stainless steel, or the like may be used. The lid 60 is bonded to the circuit board 40 through a connection member 76, such as a seam ring, low melting point glass, or adhesive.

The electronic component 100 has, for example, the following features.

The electronic component 100 includes the mounting plate (pedestal plate) 10, the heating element 20 arranged on the mounting plate 10, and the resonator element 30 arranged on the heating element 20. In this way, since the resonator element 30 is arranged on the heating element 20, heat generated by the heating element 20 is transmitted to the resonator element 30 by heat conduction without passing through other members (excluding the connection member 74). Accordingly, for example, it is possible to shorten the conduction path of heat and to efficiently heat the resonator element 30 compared to a case where the resonator element 30 is arranged on another member, such as the mounting plate 10 or the circuit board 40.

In the electronic component 100, the mounting plate 10 overlaps the resonator element 30 in a plan view. For this reason, it is possible to heat the resonator element 30 by heat emission (heat radiation) from the mounting plate 10 heated by the heating element 20.

That is, in the electronic component 100, it is possible to heat the resonator element 30 by both heat conduction and heat emission (heat radiation). Accordingly, it is possible to efficiently heat the resonator element 30. For this reason, when the electronic component 100 is an OCXO, since it becomes easy to uniformly heat the resonator element 30, for example, it is possible to increase a frequency stabilization temperature and to improve frequency stability.

In the electronic component 100, the resonator element 30 is arranged within the outer peripheral portion of the mounting plate 10 in the plan view. For this reason, it is possible to uniformly heat the resonator element 30 by heat emission (heat radiation) from the mounting plate 10.

The electronic component 100 includes the circuit board 40, and the electronic element 50 arranged on the circuit board 40, and the mounting plate 10 overlaps the electronic element 50 in the plan view. For this reason, it is possible to heat the electronic element 50 by heat emission (heat radiation) from the mounting plate 10. With this, it is possible to suppress change in characteristics due to change in temperature of the electronic element 50.

In the electronic component 100, the electronic element 50 includes the oscillation circuit for oscillating the resonator element 30. In the electronic component 100, since the electronic element 50 can be heated in the above-described manner, it is possible to reduce errors due to the temperature characteristics of the oscillation circuit, for example, frequency fluctuation or the like.

In the electronic component 100, in regard to the material of the mounting plate 10, at least the first surface 12a of the mounting plate 10 or the entire mounting plate 10 is formed of one of copper, gold, silver, aluminum, and tungsten, or an alloy containing one of copper, gold, silver, aluminum, and tungsten as a main component. For this reason, the mounting plate 10 can have high thermal conductivity. Accordingly, in the electronic component 100, it is possible to efficiently heat the resonator element 30 and the electronic element 50.

1.2. Method of Manufacturing Electronic Component

Next, a method of manufacturing the electronic component 100 according to the first embodiment will be described referring to FIGS. 1 and 2.

First, the circuit board 40 is prepared. The circuit board 40 is formed, for example, by molding and laminating a ceramic green sheet and then performing baking. Next, the electronic element 50, the mounting plate 10, the heating element 20, and the resonator element 30 are housed in the housing chamber 42 of the circuit board 40.

Specifically, for example, the electronic element 50 is connected to the first surface 44a of the circuit board 40 by an adhesive or the like, and each electrode (pad) provided on the upper surface of the electronic element 50 is electrically connected to each electrode provided on the second surface 44b of the circuit board 40 by the wire 82. Next, the mounting plate 10 is connected to the third surface 44c of the circuit board 40 by the connection members 70. Next, the heating element 20 is fixed onto the mounting plate 10 by the connection member 72, and the resonator element 30 is connected onto the heating element 20 by the connection member 74. Next, each electrode (pad) provided on the upper surface of the heating element 20 is electrically connected to each electrode provided on the third surface 44c of the circuit board 40 by the wire 80.

Next, the frequency adjustment of the resonator element 30 is performed. The frequency adjustment of the resonator element 30 is performed, for example, by etching the electrodes (not shown) on the resonator element 30 or the surface of the resonator element 30 with laser or ion beams while oscillating the resonator element 30. The frequency adjustment of the resonator element 30 may be performed by adding mass to the electrodes (not shown) on the resonator element 30 or the surface of the resonator element 30 using a method, such as vapor deposition, sputtering, spraying, or coating.

Next, the lid 60 is bonded to the circuit board 40 through the connection member 76. This process is performed in a reduced pressure atmosphere or in an inert gas atmosphere, such as nitrogen, argon, or helium, whereby the space for housing the resonator element 30 and the like can be in a reduced pressure state or in a state where inert gas is sealed. The frequency adjustment of the resonator element 30 may be performed after this process. In this case, the lid 60 is made of a transparent material to laser or ion beams.

With the above process, it is possible to manufacture the electronic component 100.

1.3. Modification Examples

Next, modification examples of the electronic component according to the first embodiment will be described. In electronic components (electronic components 200 and 300) according to the modification examples of the first embodiment described below, the members having the same functions as the members of the above-described electronic component 100 are represented by the same reference numerals, and detailed description thereof will not be repeated.

1. First Modification Example

Figure 4:
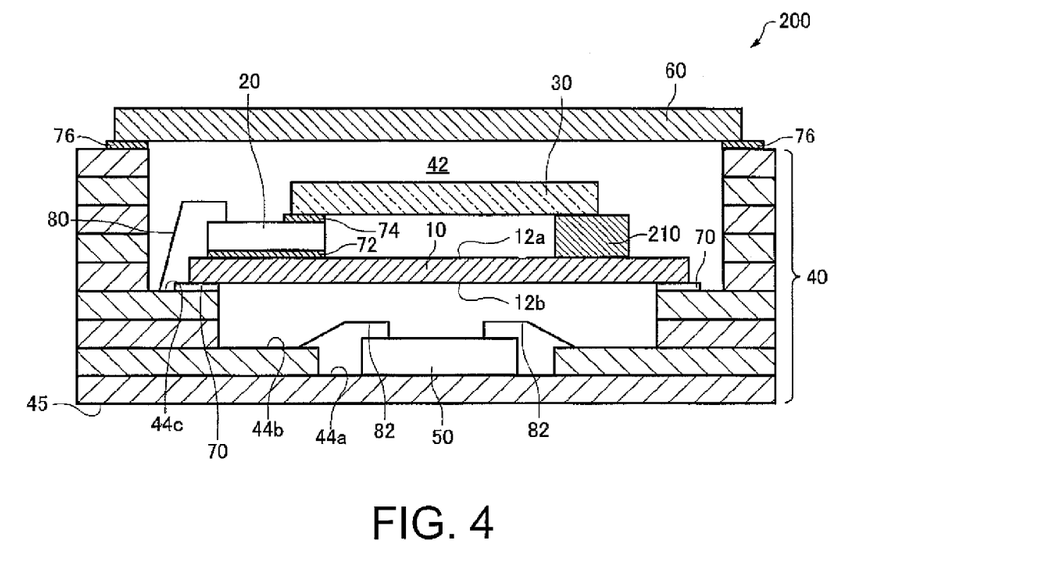
FIG. 4 is a sectional view schematically showing an electronic component according to a first modification example of the first embodiment.

First, a first modification example of the electronic component according to the first embodiment will be described referring to the drawings. FIG. 4 is a sectional view schematically showing an electronic component 200 according to the first modification example of the first embodiment. FIG. 4 corresponds to FIG. 1.

In the electronic component 200, as shown in FIG. 4, the mounting plate 10 is provided with a protrusion 210.

The protrusion 210 is provided on the first surface 12a of the mounting plate 10. The protrusion 210 protrudes toward the resonator element 30. That is, the distance (shortest distance) between the protrusion 210 and the resonator element 30 is smaller than the distance (shortest distance) between the mounting plate 10 (first surface 12a) and the resonator element 30. In the example shown in the drawing, the protrusion 210 is in contact with the resonator element 30. For example, when the resonator element 30 has a resonating region and a non-resonating region, the protrusion 210 is in contact with the non-resonating region of the resonator element 30. Though not shown, the protrusion 210 and the resonator element 30 may be separated from each other.

The protrusion 210 overlaps the resonator element 30 in a plan view. A plurality of protrusions 210 may be provided at positions overlapping the resonator element 30 in the plan view.

The protrusion 210 is, for example, a member separate from the mounting plate 10. It is preferable that the protrusion 210 has high thermal conductivity. The material of the protrusion 210 is, for example, one of copper, gold, silver, aluminum, and tungsten, or an alloy containing one of copper, gold, silver, aluminum, and tungsten as a main component.

The protrusion 210 may be a member integrated with the mounting plate 10. For example, apart of the first surface 12a of the mounting plate 10 may protrude to form the protrusion 210.

In the electronic component 200, the mounting plate 10 is provided with the protrusion 210 which protrudes toward the resonator element 30, and the protrusion 210 overlaps the resonator element 30 in the plan view. For this reason, when the protrusion 210 is in contact with the resonator element 30, heat generated by the heating element 20 is transmitted to the resonator element 30 through the connection member 72, the mounting plate 10, and the protrusion 210 by heat conduction.

When the protrusion 210 is not in contact with the resonator element 30, heat generated by the heating element 20 is transmitted to the protrusion 210 through the connection member 72 and the mounting plate 10 by heat conduction, and the protrusion 210 is heated. Then, the resonator element 30 is heated by heat emission (heat radiation) from the heated protrusion 210 near the resonator element 30.

In this way, in the electronic component 200, the mounting plate 10 is provided with the protrusion 210, whereby it is possible to increase the path of heat for heating the resonator element 30 compared to the example of the electronic component 100 described above. Therefore, in the electronic component 200, it is possible to more uniformly heat the resonator element 30.

2. Second Modification Example

Figure 5:
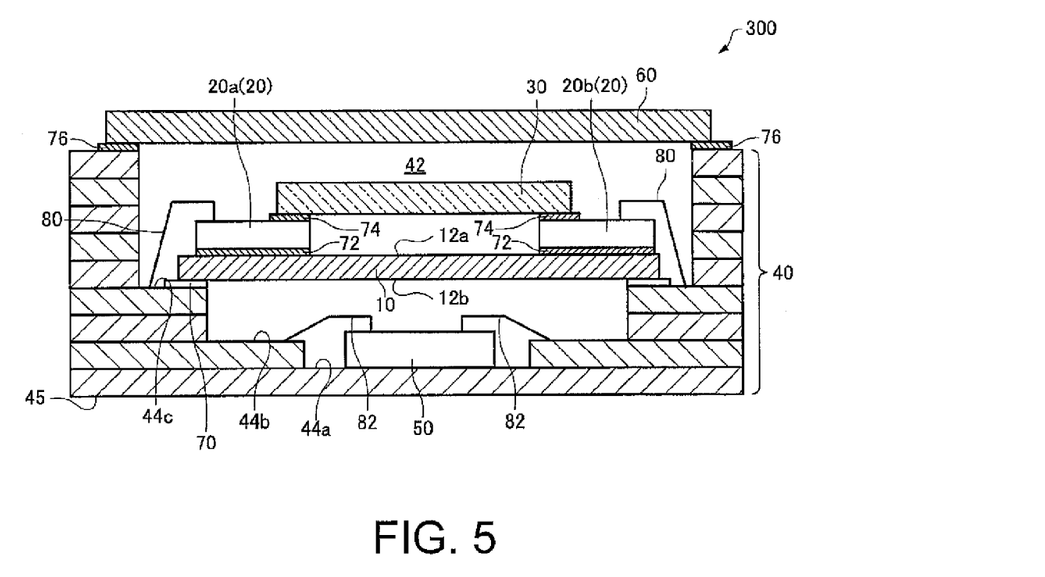
FIG. 5 is a sectional view schematically showing an electronic component according to a second modification example of the first embodiment.

Next, a second modification example of the electronic component according to the first embodiment will be described referring to the drawings. FIG. 5 is a sectional view schematically showing an electronic component 300 according to the second modification example of the first embodiment. FIG. 5 corresponds to FIG. 1.

In the electronic component 300, as shown in FIG. 5, two heating elements 20a and 20b are arranged on the mounting plate 10.

The resonator element 30 is arranged on the two heating elements 20a and 20b. The number of heating elements 20a and 20b provided on the mounting plate 10 is not particularly limited, and three or more heating elements may be provided. The heating elements 20a and 20b are provided at positions overlapping the resonator element 30 in the plan view. In the example shown in the drawing, the heating element 20b is provided instead of the above-described protrusion 210 (see FIG. 4).

In the electronic component 300, since a plurality of heating elements 20 are arranged on the mounting plate 10, and the resonator element 30 is arranged on a plurality of heating elements 20a and 20b, it is possible to more uniformly heat the resonator element 30. The resonator element 30 may be arranged on one heating element (for example, only the heating element 20a), and may not be arranged on (may not be connected to) the other heating element (for example, the heating element 20b). Even in this case, since the resonator element 30 is heated by conduction from the heating element 20a, radiation from the mounting plate 10 heated by the heating element 20a and the heating element 20b, and radiation from the heating element 20b, it is possible to more uniformly heat the resonator element 30.

2. Second Embodiment

Figure 6:
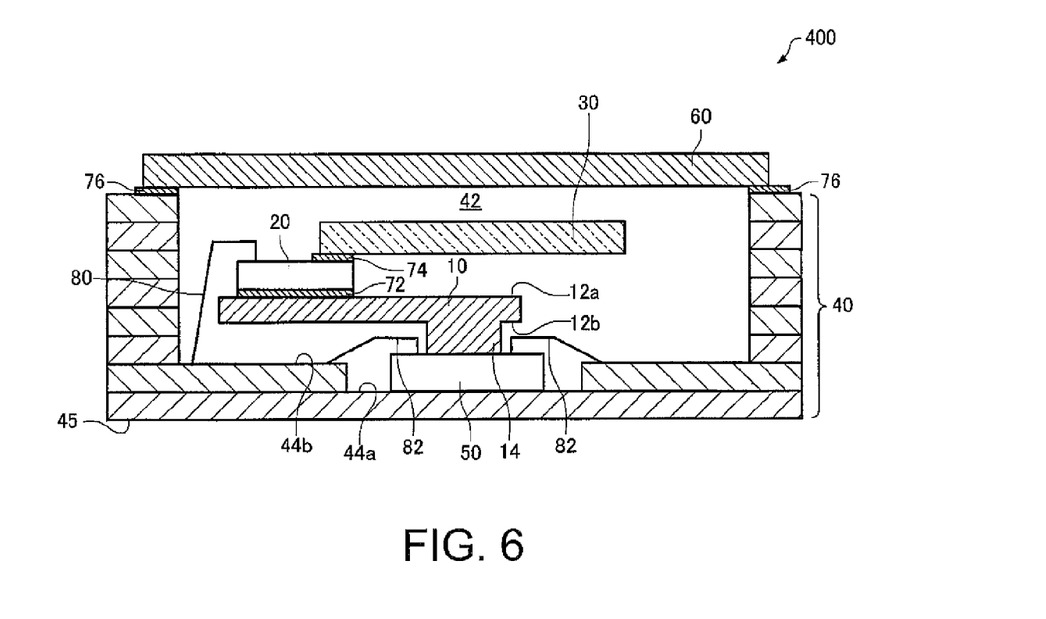
FIG. 6 is a sectional view schematically showing an electronic component according to a second embodiment.

Next, an electronic component according to a second embodiment will be described referring to the drawings. FIG. 6 is a sectional view schematically showing an electronic component 400 according to the second embodiment. FIG. 6 corresponds to FIG. 1.

In the electronic component 400 according to the second embodiment described below, the members having the same functions as the members of the above-described electronic component 100 are represented by the same reference numerals, and detailed description will not be repeated.

In the above-described electronic component 100, as shown in FIG. 1, the mounting plate 10 is arranged on the circuit board 40.

Meanwhile, in the electronic component 400, as shown in FIG. 6, the mounting plate 10 is arranged on the electronic element 50. Since the electronic element 50 may change in characteristics with change in temperature, in addition to the resonator element 30, the electronic element 50 is preferably heated at constant temperature. In this embodiment, a more preferable configuration for heating the electronic element 50 at constant temperature will be described.

The mounting plate 10 is connected to the upper surface of the electronic element 50 through a connection member (not shown), such as an adhesive. In the example shown in the drawing, the mounting plate 10 has a convex portion 14 protruding toward the electronic element 50 on the second surface 12b of the mounting plate 10, and the convex portion 14 is connected to the electronic element 50. The surface (upper surface) of the electronic element 50, on which the mounting plate 10 is arranged, is the surface on which the electrodes (not shown) of the electronic element 50 are provided.

The mounting plate 10 overlaps the resonator element 30 in the plan view. In the example shown in the drawing, a part of the mounting plate 10 overlaps a part of the resonator element 30. Here, the path of heat generated by the heating element 20 will be described. Heat generated by the heating element 20 is transmitted to the resonator element 30 through the connection member 74 by heat conduction. With this, the resonator element 30 is heated. Furthermore, heat generated by the heating element 20 is transmitted to the mounting plate 10 through the connection member 72 by heat conduction. With this, the mounting plate 10 is heated. Then, heat is emitted (radiated) from the heated mounting plate 10. The resonator element 30 and the electronic element 50 are heated by heat emission (heat radiation) from the mounting plate 10. Furthermore, heat generated by the heating element 20 is transmitted to the electronic element 50 through the connection member 72 and the mounting plate 10 by heat conduction. With this, the electronic element 50 is heated.

The electrodes (not shown) wire-bonded to the electrodes of the heating element 20 are provided on the second surface 44b of the circuit board 40.

The electronic component 400 includes the circuit board 40, and the electronic element 50 arranged on the circuit board 40, and the mounting plate 10 is arranged on the electronic element 50. For this reason, heat generated by the heating element 20 is transmitted to the electronic element 50 through the connection member 72 and the mounting plate 10 by heat conduction. Accordingly, for example, since heat is transmitted without passing through the circuit board 40 compared to a case where the mounting plate 10 is arranged on the circuit board 40 (for example, see FIG. 1), it is possible to shorten the conduction path of heat. Therefore, in the electronic component 400, it is possible to more efficiently heat the electronic element 50.

A method of manufacturing the electronic component 400 is the same as the method of manufacturing the electronic component 100 described above, thus, description thereof will not be repeated.

2.1. Modification Examples

Next, modification examples of the electronic component according to the second embodiment will be described. In electronic components (electronic components 500, 600, and 700) according to the modification examples of the second embodiment described below, the members having the same functions as the members of the above-described electronic component 400 are represented by the same reference numerals, and detailed description thereof will not be repeated.

1. First Modification Example

Figure 7:
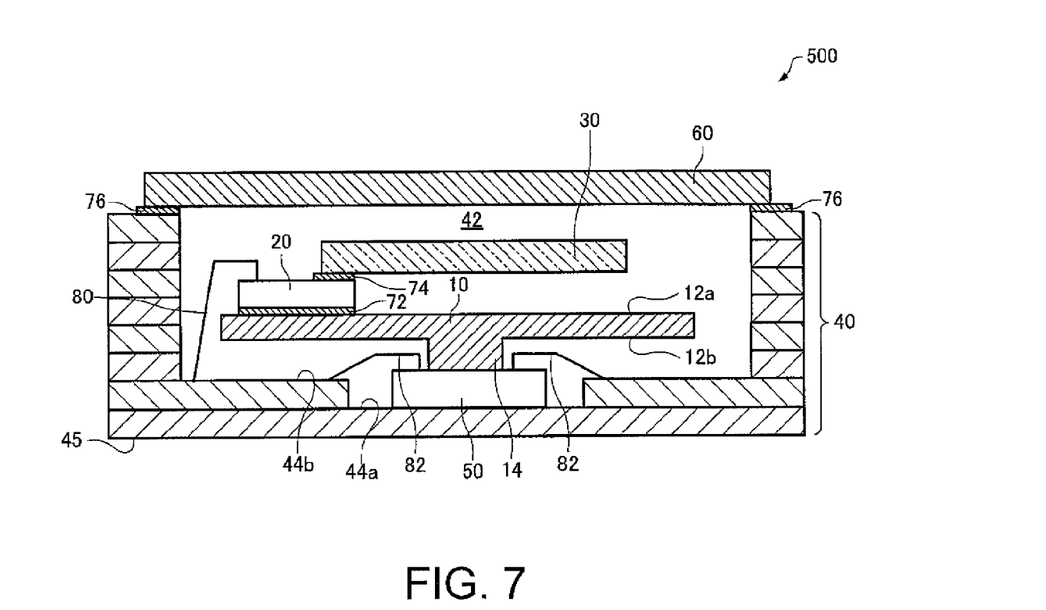
FIG. 7 is a sectional view schematically showing an electronic component according to a first modification example of the second embodiment.

First, a first modification example of the electronic component according to the second embodiment will be described referring to the drawings. FIG. 7 is a sectional view schematically showing an electronic component 500 according to the first modification example of the second embodiment. FIG. 7 corresponds to FIG. 6.

The electronic component 500 is different from the above-described electronic component 400 in that, as shown in FIG. 7, the resonator element 30 is arranged within the outer peripheral portion (outer edge) of the mounting plate 10 in a plan view.

In the electronic component 500, since the resonator element 30 is arranged within the outer peripheral portion of the mounting plate 10 in the plan view, for example, it is possible to more uniformly heat the resonator element 30 by heat emission (heat radiation) from the mounting plate 10 compared to the example of the electronic component 400.

2. Second Modification Example

Figure 8:
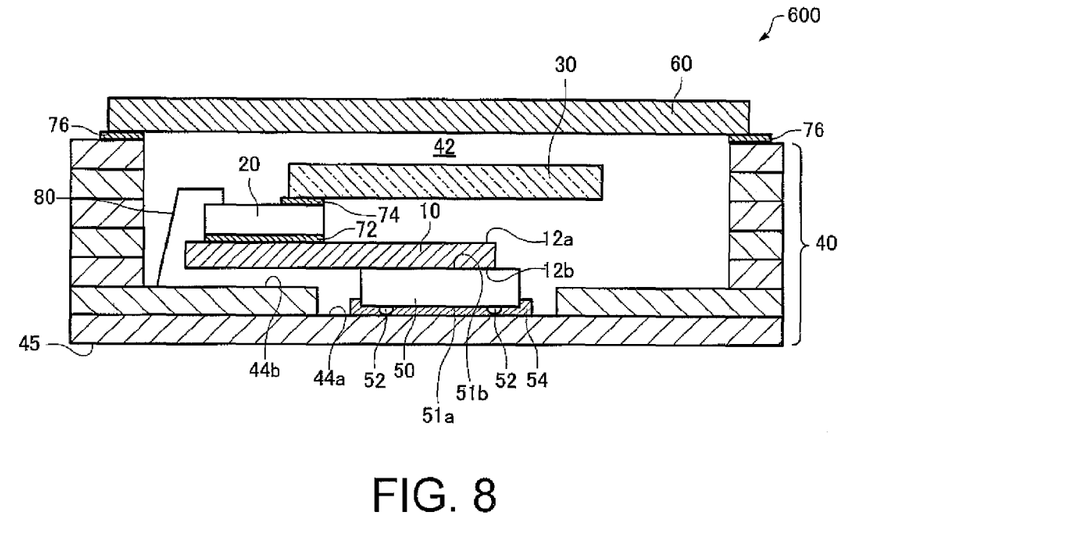
FIG. 8 is a sectional view schematically showing an electronic component according to a second modification example of the second embodiment.

Next, a second modification example of the electronic component according to the second embodiment will be described referring to the drawings. FIG. 8 is a sectional view schematically showing an electronic component 600 according to the second modification example of the second embodiment. FIG. 8 corresponds to FIG. 6.

The electronic component 600 is different from the above-described electronic component 400 in that, as shown in FIG. 8, the electronic element 50 is electrically connected to the circuit board 40 through bumps 52.

The electronic element 50 is connected by the bumps 52, for example, in a state where a circuit forming surface 51a on which the circuit of the electronic element 50 is formed turns toward the circuit board 40 (facedown bonding). For example, resin 54 (underfill material) is filled in a gap between the electronic element 50 and the circuit board 40.

The mounting plate 10 is arranged on a surface 51b opposite to the circuit forming surface 51a of the electronic element 50.

In the electronic component 600, since the electronic element 50 is electrically connected through the bumps 52, for example, the wire 82 (see FIG. 6) is not required compared to the example of the electronic component 400 described above, and it is possible to achieve reduction in size and thickness of the apparatus.

In the electronic component 600, since the mounting plate 10 is arranged on the surface 51*b* opposite to the circuit forming surface 51*a*, there are few restrictions for arranging the mounting plate 10. For example, when the mounting plate 10 is arranged on the circuit forming surface 51*a*, the mounting plate 10 should be provided to avoid the circuit formed on the circuit forming surface 51*a* or the electrodes (pads), and there are many restrictions for arranging the mounting plate 10.

3. Third Modification Example

Figure 9:
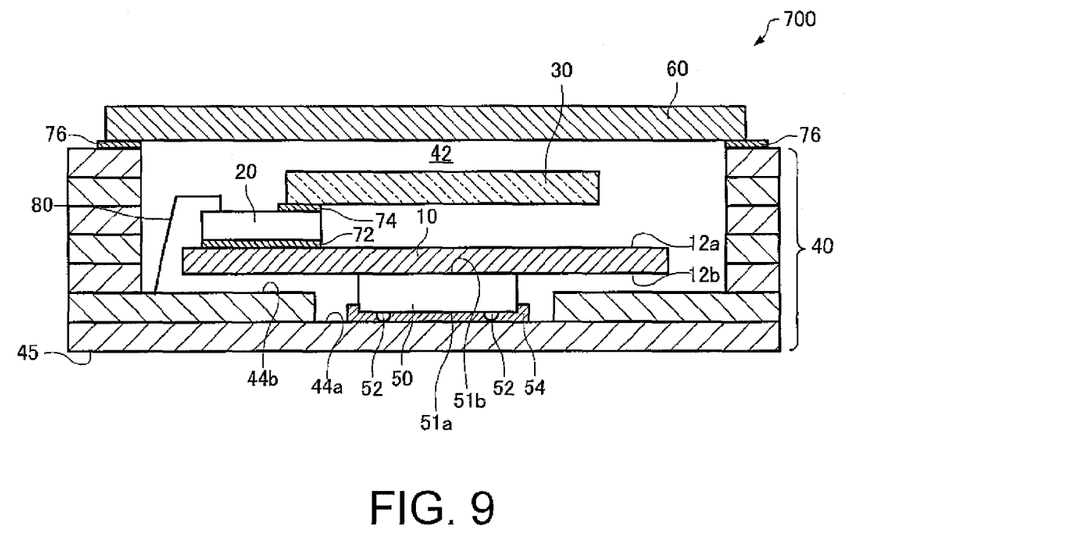
FIG. 9 is a sectional view schematically showing an electronic component according to a third modification example of the second embodiment.

Next, a third modification example of the electronic component according to the second embodiment will be described referring to the drawings. FIG. 9 is a sectional view schematically showing an electronic component 700 according to the third modification example of the second embodiment. FIG. 9 corresponds to FIG. 6.

The electronic component 700 is different from the above-described electronic component 400 in that, as shown in FIG. 9, the resonator element 30 is arranged within the outer peripheral portion (outer edge) of the mounting plate 10 in a plan view.

In the electronic component 700, similarly to the above-described electronic component 600 (see FIG. 8), the electronic element 50 is electrically connected to the circuit board 40 through the bumps 52.

In the electronic component 700, since the resonator element 30 is arranged within the outer peripheral portion of the mounting plate 10 in the plan view, for example, it is possible to more uniformly heat the resonator element 30 by heat emission (heat radiation) from the mounting plate 10 compared to the example of the electronic component 400 or the electronic component 600.

3. Third Embodiment

Figure 10:
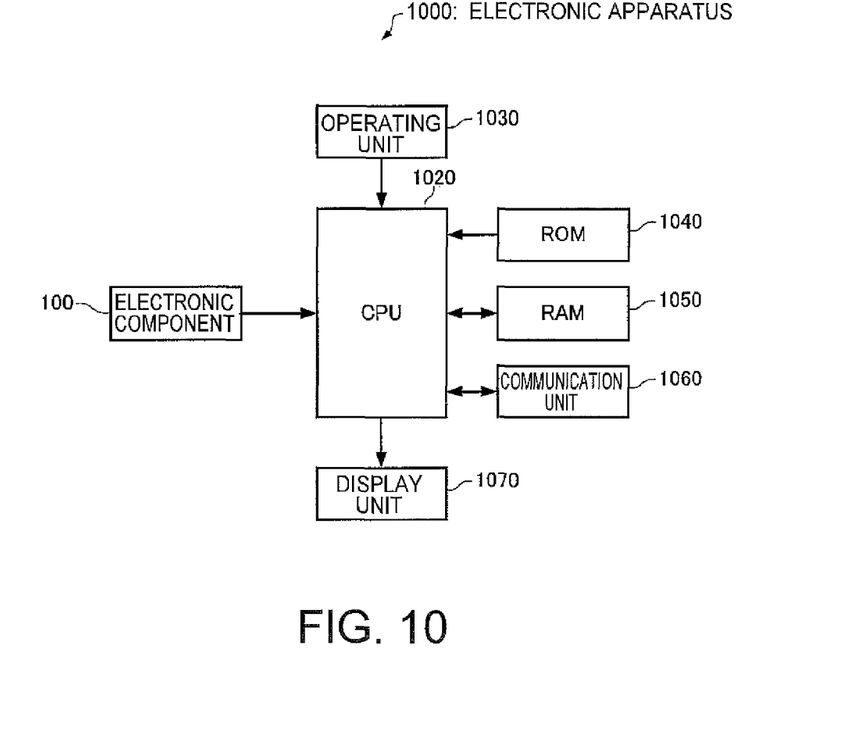
FIG. 10 is a functional block diagram of an electronic apparatus of a third embodiment.

Next, an electronic apparatus according to a third embodiment will be described referring to the drawings. FIG. 10 is a functional block diagram of the electronic apparatus of the third embodiment.

An electronic apparatus 1000 includes an electronic component according to an embodiment of the invention. Here, as shown in FIG. 10, a case where the electronic component 100 is used as an electronic component according to an embodiment of the invention will be described.

The electronic apparatus 1000 further includes a central processing unit (CPU) 1020, an operating unit 1030, a read only memory (ROM) 1040, a random access memory (RAM) 1050, a communication unit 1060, and a display unit 1070. In the electronic apparatus of this embodiment, a part of the components (respective units) of FIG. 10 may be omitted or modified, or other components may be added.

Though not shown, the electronic component 100 includes a resonator element and a heating element, and generates an oscillation signal based on the oscillation of the resonator element heated by the heating element. The oscillation signal is output to the CPU 1020.

The CPU 1020 performs various kinds of computation processing or control processing based on the oscillation signal input from the electronic component 100 according to a program stored in the ROM 1040 or the like. In addition, the CPU 1020 performs various kinds of processing according to an operation signal from the operating unit 1030, processing for controlling the communication unit 1060 in order to perform data communication with an external device, processing for transmitting a display signal in order to display various kinds of information on the display unit 1070, and the like.

The operating unit 1030 is an input device which is constituted by operation keys, button switches, or the like, and outputs an operation signal according to a user's operation to the CPU 1020.

The ROM 1040 stores a program, data, and the like for various kinds of computation processing or control processing in the CPU 1020.

The RAM 1050 is used as a work area of the CPU 1020, and temporarily stores the program or data read from the ROM 1040, data input from the operating unit 1030, arithmetic results of the CPU 1020 according to various programs, and the like. The communication unit 1060 performs various kinds of control in order to establish data communication between the CPU 1020 and the external device.

The display unit 1070 is a display device which is constituted by a liquid crystal display (LCD) or the like, and displays various kinds of information based on the display signal input from the CPU 1020. The display unit 1070 may be provided with a touch panel which functions as the operating unit 1030. Since the electronic apparatus 1000 includes the electronic component 100 which can efficiently heat the resonator element, for example, it is possible to achieve improvement of frequency stability or to reduce power consumption.

As the electronic apparatus 1000, various electronic apparatuses can be considered, and include, for example, a personal computer (for example, a mobile personal computer, a laptop personal computer, and a tablet personal computer), a mobile terminal, such as a smartphone or a mobile phone, a digital still camera, an inkjet ejection device (for example, an inkjet printer), a storage area network apparatus, such as a router and a switch, a local area network apparatus, an apparatus for a mobile terminal base station, a television set, a video camera, a video recorder, a car navigation system, a real time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (for example, an electronic thermometer, a blood pressure monitor, a blood glucose monitor, an electrocardiograph, ultrasonic diagnostic equipment, and an electronic endoscope), a fish finder, a variety of measuring instruments, gauges (for example, gauges for cars, aircrafts, and boats and ships), a flight simulator, a head-mount display, a motion tracer, a motion tracker, a motion controller, and a pedestrian dead reckoning (PDR) system.

4. Fourth Embodiment

Figure 11:
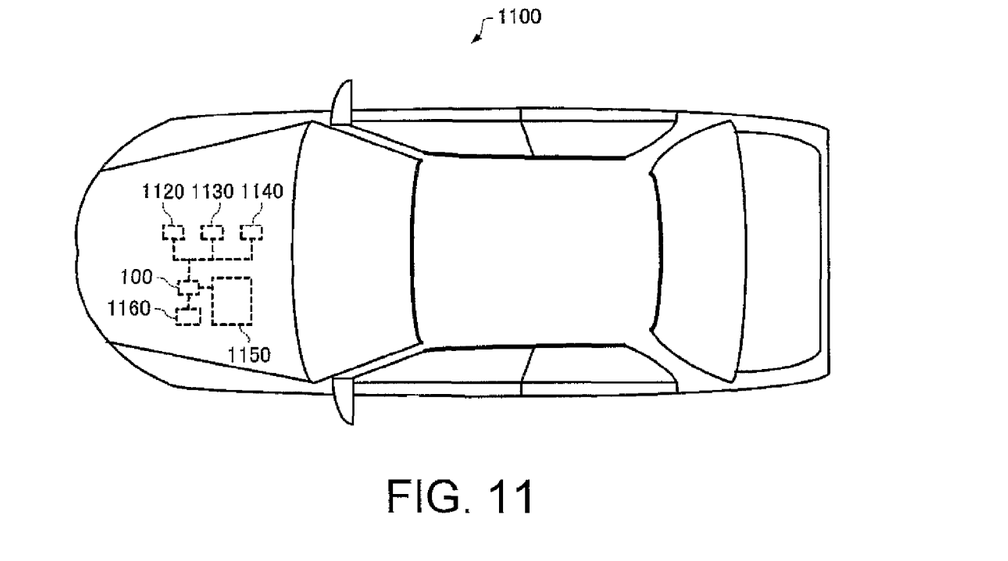
FIG. 11 is a diagram showing an example of a moving object of a fourth embodiment.

Next, a moving object according to a fourth embodiment will be described referring to the drawings. FIG. 11 is a diagram (top view) showing an example of the moving object of the fourth embodiment.

The moving object 1100 includes an electronic component according to an embodiment of the invention. Here, as shown in FIG. 11, a case where the electronic component 100 is used as an electronic component according to an embodiment of the invention will be described.

The moving object 1100 further includes controllers 1120, 1130, and 1140 which perform various kinds of control of an engine system, a brake system, a keyless entry system, and the like, a battery 1150, and a backup battery 1160. In the moving object of this embodiment, a part of the components (respective units) of FIG. 11 may be omitted, or other components may be added. Though not shown, the electronic component 100 includes a resonator element and a heating element, and generates an oscillation signal based on the oscillation of the resonator element heated by the heating element. The oscillation signal is output from the electronic component 100 to the controllers 1120, 1130, and 1140.

The battery 1150 supplies power to the electronic component 100 and the controllers 1120, 1130, and 1140. The backup battery 1160 supplies power to the electronic component 100 and the controllers 1120, 1130, and 1140 when the output voltage of the battery 1150 falls below a threshold value.

Since the moving object 1100 includes the electronic component 100 which can efficiently heat the resonator element, for example, it is possible to achieve improvement of frequency stability or to reduce power consumption.

Various moving objects are considered as the moving object 1100, and for example, an automobile (including an electric automobile), an aircraft, such as a jet plane or a helicopter, a vessel, a rocket, an artificial satellite, and the like are considered.

The various embodiments of the invention are not limited to the above-described embodiments, and various modifications may be made within the spirit and scope of the various embodiments.

For example, in the above-described embodiments, although the mounting plate 10 is a plate where at least the first surface 12a is made of a metal or a plate which is made of a metal as a whole, the mounting plate 10 is not limited to the above-described configuration insofar as thermal conductivity is high. The mounting plate 10 may be, for example, a ceramics plate or a quartz crystal plate.

The embodiments and the modification examples described above are illustrative only, and the various embodiments of the invention are not limited thereto. For example, the embodiments and the modification examples described above may be appropriately combined with each other.

The various embodiments of the invention include configurations (for example, configurations having the same function, the same way, and the same result, or configurations having the same object and the same advantages) substantially the same as the configuration described in the embodiments of the invention. Furthermore, the various embodiments of the invention include configurations obtained by replacing a non-essential part of the configuration described in the embodiments of the invention. Furthermore, the various embodiments of the invention include configurations exerting the same functional effects and configurations capable of achieving the same object as the configuration described in the embodiments of the invention. Furthermore, the various embodiments of the invention include configurations obtained by adding technologies known to the public to the configuration described in the embodiments of the invention.

What is claimed is:

1. An electronic component comprising:
   a pedestal plate which has a first surface and a second surface to be an opposite surface of the first surface, the first surface being made of a metal;
   a heating element which is arranged on the first surface of the pedestal plate; and
   a resonator element which is arranged on the heating element,
   wherein the pedestal plate overlaps the resonator element in plan view, and
   wherein the heating element is between, with respect to a vertical direction of the electronic component, the resonator element and the pedestal plate.

2. The electronic component according to claim 1,
   wherein the resonator element is surrounded by an outer peripheral portion of the pedestal plate in the plan view.

3. The electronic component according to claim 1,
   wherein the pedestal plate is provided with a protrusion protruding toward the resonator element, and
   the protrusion overlaps the resonator element in the plan view.

4. The electronic component according to claim 1, further comprising:
   a circuit board; and
   an electronic element arranged on the circuit board,
   wherein the pedestal plate is arranged on the circuit board and overlaps the electronic element in the plan view.

5. The electronic component according to claim 1, further comprising:
   a circuit board;
   an electronic element arranged on the circuit board,
   wherein the pedestal plate is arranged on the electronic element.

6. The electronic component according to claim 4,
   wherein the electronic element includes an oscillation circuit for oscillating the resonator element.

7. The electronic component according to claim 5,
   wherein the electronic element includes an oscillation circuit for oscillating the resonator element.

8. The electronic component according to claim 4,
   wherein the electronic element is electrically connected to the circuit board through bumps.

9. The electronic component according to claim 5,
   wherein the electronic element is electrically connected to the circuit board through bumps.

10. The electronic component according to claim 1,
    wherein the pedestal plate is made entirely of the metal.

11. The electronic component according to claim 10,
    wherein the metal is one of copper, gold, silver, aluminum, or tungsten, or an alloy containing one of copper, gold, silver, aluminum, or tungsten as a main component.

12. An electronic apparatus comprising:
    the electronic component according to claim 1.

13. An electronic apparatus comprising:
    the electronic component according to claim 2.

14. A moving object comprising:
    the electronic component according to claim 1.

15. A moving object comprising:
    the electronic component according to claim 2.

16. The electronic component according to claim 1,
    wherein the resonator element is mounted on the heating element.

17. An electronic component comprising:
    a mounting plate having opposing first and second surfaces, the first surface made of metal;
    a heating element coupled to the first surface of the mounting plate; and
    a resonator element with a portion thereon coupled to a surface of the heating element opposite a surface to which the mounting plate is coupled, the resonator element extending beyond an end of the heating element and overlapping the mounting plate, wherein the heating element is between, with respect to a vertical direction of the electronic component, the resonator element and the mounting plate.

18. The electronic component according to claim 17, wherein the resonator element extends in a cantilevered arrangement from the heating element.

* * * * *